US010294806B2

(12) United States Patent
Riley et al.

(10) Patent No.: US 10,294,806 B2
(45) Date of Patent: May 21, 2019

(54) MULTIPLE COATING CONFIGURATION

(71) Applicant: United Technologies Corporation, Hartford, CT (US)

(72) Inventors: Sarah Riley, Glastonbury, CT (US); Jeffrey R. Levine, Vernon Rockville, CT (US); Mark A. Boeke, Plainville, CT (US)

(73) Assignee: UNITED TECHNOLOGIES CORPORATION, Farmington, CT (US)

(*) Notice: Subject to any disclaimer, the term of this patent is extended or adjusted under 35 U.S.C. 154(b) by 906 days.

(21) Appl. No.: 14/770,189

(22) PCT Filed: Mar. 11, 2014

(86) PCT No.: PCT/US2014/022981

§ 371 (c)(1),
(2) Date: Aug. 25, 2015

(87) PCT Pub. No.: WO2014/150335

PCT Pub. Date: Sep. 25, 2014

(65) Prior Publication Data

US 2016/0017733 A1 Jan. 21, 2016

Related U.S. Application Data

(60) Provisional application No. 61/788,373, filed on Mar. 15, 2013.

(51) Int. Cl.

| | |
|---|---|
| ***F01D 9/04*** | (2006.01) |
| ***C23C 14/04*** | (2006.01) |

(Continued)

(52) U.S. Cl.

CPC ................ *F01D 9/041* (2013.01); *C23C 4/01* (2016.01); *C23C 4/02* (2013.01); *C23C 4/11* (2016.01);

(Continued)

(58) Field of Classification Search

CPC ......... C23C 14/04; C23C 14/22; C23C 14/30; C23C 4/01; C23C 4/02; C23C 4/11;

(Continued)

(56) References Cited

U.S. PATENT DOCUMENTS 5,753,053 A 5/1998 Smashey et al.
6,057,047 A 5/2000 Maloney (Continued)

FOREIGN PATENT DOCUMENTS

EP 2108715 10/2009

OTHER PUBLICATIONS

Clarke, D.R., Oechsner, M., and Padture, N.P. (2012). Thermal-barrier coatings for more efficient gas-turbine engines. MRS Bulletin, 87. Oct. 2012.

(Continued)

*Primary Examiner* — Mark A Laurenzi
*Assistant Examiner* — Paul W Thiede
(74) *Attorney, Agent, or Firm* — Carlson, Gaskey & Olds, P.C.

(57) ABSTRACT

An article includes a body that has a coating thereon. The coating has a first portion disposed on a first section of the body and a second portion disposed on a second, different section of the body. The first portion has a first microstructure and the second portion has a second, different microstructure.

16 Claims, 2 Drawing Sheets

(51) Int. Cl.

| | |
|---|---|
| ***C23C 4/02*** | (2006.01) |
| ***C23C 4/11*** | (2016.01) |
| ***C23C 4/01*** | (2016.01) |
| ***C23C 4/12*** | (2016.01) |
| ***C23C 14/22*** | (2006.01) |
| ***C23C 4/134*** | (2016.01) |
| ***F01D 5/28*** | (2006.01) |
| ***C23C 14/30*** | (2006.01) |

(52) U.S. Cl.

CPC ................ *C23C 4/12* (2013.01); *C23C 4/134* (2016.01); *C23C 14/04* (2013.01); *C23C 14/22* (2013.01); *C23C 14/30* (2013.01); *F01D 9/044* (2013.01); *F01D 5/288* (2013.01); *F05D 2220/32* (2013.01); *F05D 2230/90* (2013.01); *F05D 2240/12* (2013.01); *F05D 2250/62* (2013.01); *F05D 2250/63* (2013.01); *F05D 2300/20* (2013.01); *F05D 2300/605* (2013.01); *F05D 2300/606* (2013.01)

(58) Field of Classification Search

CPC . C23C 4/12; C23C 4/134; F01D 5/288; F01D 9/041; F01D 9/044; F05D 2220/32; F05D 2230/90; F05D 2240/12; F05D 2250/62; F05D 2250/63; F05D 2300/20; F05D 2300/605; F05D 2300/606

USPC ...................................... 416/241 R; 428/623

See application file for complete search history.

(56) References Cited

U.S. PATENT DOCUMENTS

| | | | |
|---|---|---|---|
| 2004/0146657 | A1 | 7/2004 | Heuser et al. |
| 2006/0280926 | A1 | 12/2006 | Spitsberg et al. |
| 2011/0033284 | A1 | 2/2011 | Tryon et al. |
| 2011/0244138 | A1 | 10/2011 | Schlichting et al. |

OTHER PUBLICATIONS

Supplementary European Search Report for European Patent Application No. 14768998 completed Sep. 20, 2016.

The International Search Report and Written Opinion for PCT Application No. PCT/US2014/022981, dated Jul. 8, 2014.

International Preliminary Report on Patentability for PCT Application No. PCT/US2014/022981 dated Sep. 24, 2015.

MULTIPLE COATING CONFIGURATION

BACKGROUND

A gas turbine engine typically includes a fan section, a compressor section, a combustor section and a turbine section. Air entering the compressor section is compressed and delivered into the combustion section where it is mixed with fuel and ignited to generate a high-speed exhaust gas flow. The high-speed exhaust gas flow expands through the turbine section to drive the compressor and the fan section. The compressor section typically includes low and high pressure compressors, and the turbine section includes low and high pressure turbines.

The high pressure turbine drives the high pressure compressor through an outer shaft to form a high spool, and the low pressure turbine drives the low pressure compressor through an inner shaft to form a low spool. The fan section may also be driven by the low inner shaft. A direct drive gas turbine engine includes a fan section driven by the low spool such that the low pressure compressor, low pressure turbine and fan section rotate at a common speed in a common direction.

A speed reduction device, such as an epicyclical gear assembly, may be utilized to drive the fan section such that the fan section may rotate at a speed different than the turbine section. In such engine architectures, a shaft driven by one of the turbine sections provides an input to the epicyclical gear assembly that drives the fan section at a reduced speed.

SUMMARY

An article according to an example of the present disclosure includes a body that has a coating thereon. The coating has a first portion disposed on a first section of the body and a second portion disposed on a second, different section of the body. The first portion has a first microstructure and the second portion has a second, different microstructure.

In a further embodiment of any of the foregoing embodiments, the coating is a ceramic-based coating.

In a further embodiment of any of the foregoing embodiments, the first section is on a platform and the second section is on an airfoil attached to the platform.

In a further embodiment of any of the foregoing embodiments, the first microstructure is a random grain structure and the second microstructure is a columnar microstructure.

A further embodiment of any of the foregoing embodiments includes a bond coat on the body, the bond coat having a first surface roughness at the first section of the body and a second, different roughness at the second section of the body.

A further embodiment of any of the foregoing embodiments includes a metallic bond coat on the body, the bond coat having a first surface roughness at the first section of the body and a second, different surface roughness at the second section of the body, wherein the coating is a ceramic-based coating, the first microstructure is a random grain structure and the second microstructure is a columnar microstructure.

In a further embodiment of any of the foregoing embodiments, the first surface roughness is greater than the second surface roughness.

In a further embodiment of any of the foregoing embodiments, the first portion of the coating on the first section of the body is mono-layered and the second portion of the coating on the second section of the body is mono- or multi-layered.

In a further embodiment of any of the foregoing embodiments, the coating is a ceramic-based coating and the first microstructure and the second microstructure differ in grain structure.

In a further embodiment of any of the foregoing embodiments, the first portion of the coating on the first section of the body has an equivalent composition to the second portion of the coating on the second section of the body.

In a further embodiment of any of the foregoing embodiments, the body is a vane assembly including first and second airfoils attached at opposed ends to, respectively, first and second platforms.

A method of coating an article according to an example of the present disclosure includes coating a body of an article with a coating, including a first portion of the coating to a first section of the body using a first coating technique and applying a second portion of the coating to a second, different section of the body using a second, different coating technique.

In a further embodiment of any of the foregoing embodiments, the coating is a ceramic-based coating.

In a further embodiment of any of the foregoing embodiments, the first section is on an airfoil and the second section is on a platform attached to the airfoil.

In a further embodiment of any of the foregoing embodiments, the first coating technique is physical vapor deposition and the second coating technique is thermal spraying.

A gas turbine engine according to an example of the present disclosure includes an article that has a body including a coating thereon. The coating has a first portion disposed on a first section of the body and a second portion disposed on a second, different section of the body. The first portion has a first microstructure and the second portion has a second, different microstructure.

In a further embodiment of any of the foregoing embodiments, the coating is a ceramic-based coating.

In a further embodiment of any of the foregoing embodiments, the article is a vane assembly including first and second airfoils attached at opposed ends to, respectively, first and second platforms.

A further embodiment of any of the foregoing embodiments includes a metallic bond coat on the body, the bond coat having a first surface roughness at the first section of the body and a second, different surface roughness at the second section of the body, wherein the coating is a ceramic-based coating, the first microstructure is a random grain structure and the second microstructure is a columnar microstructure.

In a further embodiment of any of the foregoing embodiments, the first surface roughness is greater than the second surface roughness.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
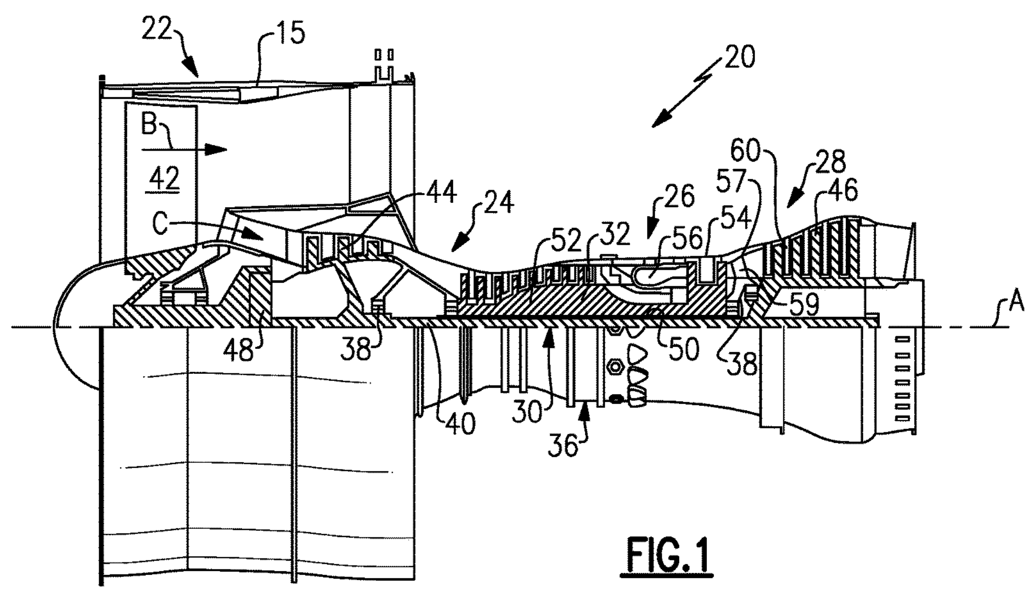
FIG. 1 illustrates an example gas turbine engine.

FIG. 1 schematically illustrates a gas turbine engine 20. The gas turbine engine 20 is disclosed herein as a two-spool turbofan that incorporates a fan section 22, a compressor section 24, a combustor section 26 and a turbine section 28. Alternative engines might include an augmentor section (not shown) among other systems or features. The fan section 22 drives air along a bypass flow path B in a bypass duct defined within a nacelle 15, while the compressor section 24 drives air along a core flow path C for compression and communication into the combustor section 26 then expansion through the turbine section 28. Although depicted as a two-spool turbofan gas turbine engine in the disclosed non-limiting embodiment, it is to be understood that the concepts described herein are not limited to use with two-spool turbofans and the teachings can be applied to other types of turbine engines, including three-spool architectures.

The engine 20 includes a low speed spool 30 and a high speed spool 32 mounted for rotation about an engine central axis A relative to an engine static structure 36 via several bearing systems, shown at 38. It is to be understood that various bearing systems at various locations may alternatively or additionally be provided, and the location of bearing systems may be varied as appropriate to the application.

The low speed spool 30 includes an inner shaft 40 that interconnects a fan 42, a low pressure compressor 44 and a low pressure turbine 46. The inner shaft 40 is connected to the fan 42 through a speed change mechanism, which in this example is a gear system 48, to drive the fan 42 at a lower speed than the low speed spool 30. The high speed spool 32 includes an outer shaft 50 that interconnects a high pressure compressor 52 and high pressure turbine 54. A combustor 56 is arranged between the high pressure compressor 52 and the high pressure turbine 54. A mid-turbine frame 57 of the engine static structure 36 is arranged between the high pressure turbine 54 and the low pressure turbine 46. The mid-turbine frame 57 further supports bearing system 38 in the turbine section 28. The inner shaft 40 and the outer shaft 50 are concentric and rotate via, for example, bearing systems 38 about the engine central axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and gear system 48 can be varied. For example, gear system 48 may be located aft of combustor section 26 or even aft of turbine section 28, and fan section 22 may be positioned forward or aft of the location of gear system 48.

The engine 20 in one example is a high-bypass geared engine. In a further example, the engine 20 has a bypass ratio that is greater than about six (6), with an example embodiment being greater than about ten (10), the gear system 48 is an epicyclic gear train, such as a planet or star gear system, with a gear reduction ratio of greater than about 2.3, and the low pressure turbine 46 has a pressure ratio that is greater than about five (5). In one disclosed embodiment, the bypass ratio is greater than about ten (10:1), the fan diameter is significantly larger than that of the low pressure compressor 44, and the low pressure turbine 46 has a pressure ratio that is greater than about five (5). Low pressure turbine 46 pressure ratio is pressure measured prior to inlet of low pressure turbine 46 as related to the pressure at the outlet of the low pressure turbine 46 prior to an exhaust nozzle. The gear system 48 can be an epicycle gear train, such as a planet or star gear system, with a gear reduction ratio of greater than about 2.3:1. It is to be understood, however, that the above parameters are only exemplary and that the present disclosure is applicable to other gas turbine engines.

A significant amount of thrust is provided by the bypass flow B due to the high bypass ratio. The fan section 22 of the engine 20 is designed for a particular flight condition—typically cruise at about 0.8 Mach and about 35,000 feet. The flight condition of 0.8 Mach and 35,000 ft, with the engine at its best fuel consumption—also known as "bucket cruise Thrust Specific Fuel Consumption ("TSFC")"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of$[(\text{Tram } °\text{R})/(518.7\ °\text{R})]^{0.5}$. The "Low corrected fan tip speed" as disclosed herein according to one non-limiting embodiment is less than about 1150 ft/second.

Figure 2:
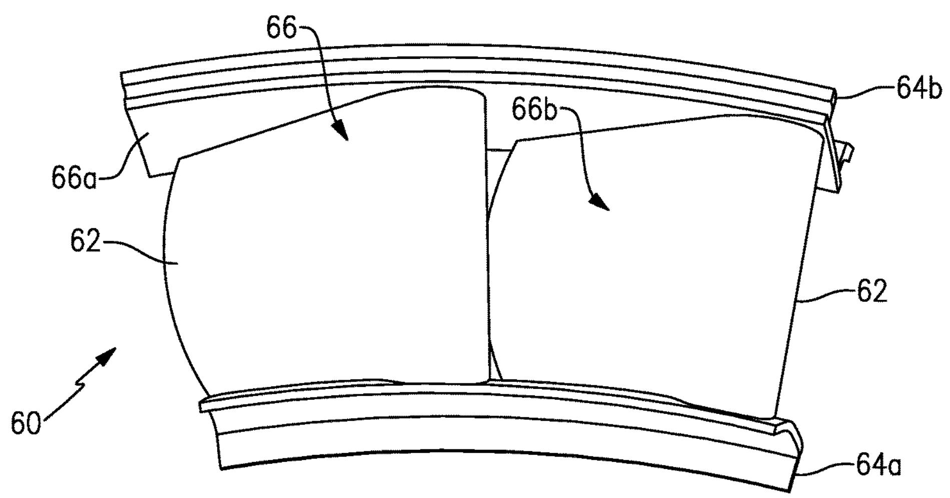
FIG. 2 illustrates an example coated article.

The engine 20 includes a plurality of vane assemblies 60 (one shown) that are circumferentially arranged in the turbine section 28. FIG. 2 shows an isolated view of one of the vane assemblies 60. In this example, the vane assembly 60 is a vane doublet that includes two airfoils 62 that are attached at their opposed ends to an inner radial platform 64*a* and an outer radial platform 64*b*. Due to the relatively severe operating conditions within the turbine section 28, the vane assembly 60 includes a protective coating 66, such as a thermal barrier coating. In this example, selected portions of a coating 66 are shown at first portion 66*a* on the radially outer platform 64*b* and at second portion 66*b* on one of the airfoils 62, although it is to be understood that the gas path surfaces of the vane assembly 60 are predominantly or fully covered by the coating 66. As an example, the coating 66 is a ceramic-based coating, such as but not limited to, yttria stabilized zirconia, gadolinia stabilized zirconia or other ceramic material. A bond coat 67 (FIG. 4), such as MCrAlY, where the M includes at least one of nickel, cobalt and iron, Cr is chromium, Al is aluminum and Y is yttrium, can be used between the underlying metallic body/substrate 68 of the vane assembly 60 and the coating 66 to enhance coating durability. The metallic body/substrate 68 can be a superalloy material, such as but not limited to a nickel- or cobalt-based alloy.

The airfoils 62 of the vane assembly 60 are relatively close together and, thus, the coating 66 can be difficult to apply to the surfaces of the airfoils 62 there between. As an example, the surfaces (i.e., suction and/or pressure side surfaces), such as the surfaces shown at the location of the second portion 66*b*, may be "shadowed" by other portions of the vane assembly 60 such that there is no line-of-sight to the surface. The term "line-of-sight" as used herein refers to a linear view line that is normal to a surface (i.e., 90° to the surface or 90° to a tangent for a curved surface) and that is uninterrupted by other portions of the vane assembly 60. A "line-of-sight surface" is therefore accessible by a line-of-sight and a "non-line-of-sight surface" is not accessible by a line-of-sight. In other words, the linear view line to the non-line-of-sight surface forms an angle of less than 90° to the non-line-of-sight surface.

Some coating techniques, such as thermal spraying, apply ceramic coatings along a line-of-sight. These techniques can be used to apply the coating onto a non-line-of-sight surface from a shallow, non-line-of-sight angle (e.g., 45°), but may not provide good coating control. Other coating techniques, such as electron-beam physical vapor deposition can be utilized to apply the coating 66 to non-line-of-sight surfaces, such as those surfaces in between the airfoils 62, with better control. However, to reliably coat such surfaces with a minimum target coating thickness, the parameters of the selected coating technique are often tailored to achieve the target minimal coating thickness on the most difficult-to-coat, non-line-of-sight surfaces. As a result of tailoring the coating technique to achieve the target minimal coating thickness on the most difficult-to-coat, non-line-of-sight surfaces, the coating thickness can deviate substantially from the target at other easy-to-coat surfaces. In this regard, the vane assembly 60 is coated using two different coating techniques, which can each be tailored to the non-line-of-sight and line-of-sight locations of the surfaces being coated.

Coating techniques can be characterized and differentiated by one or more of: the state of the starting coating of material, the method of application of the starting material onto the component to be coated, whether or not the coating material reacts, carrier fluids in which the coating material is transported, and the coating arrangement with regard to the component to be coated, coating source and/or energy source. Mere differences in coating parameters, such as carrier gas flow and material composition, between otherwise similar coating processes do not constitute different coating techniques.

Figure 3:
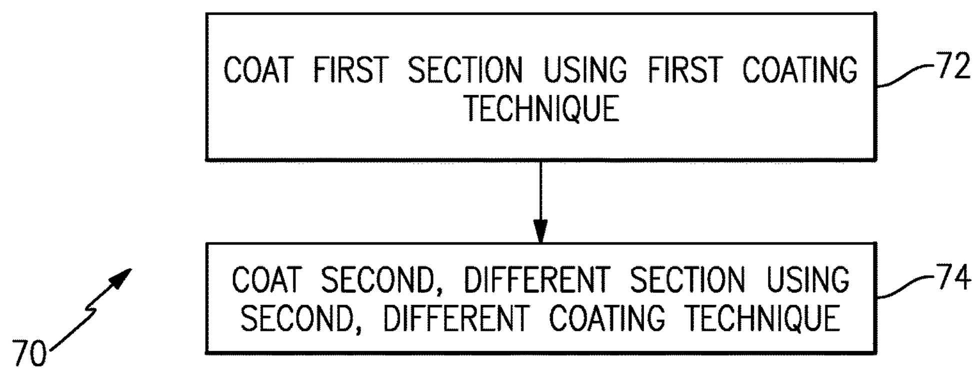
FIG. 3 illustrates an example method of coating an article.

FIG. 3 illustrates an example method 70 of coating an article, such as the vane assembly 60. The method is also applicable to other components. The method 70 includes a first coating step 72 and a second coating step 74. The first coating step 72 includes coating a first section of a component using a first coating technique, and the second coating step 74 includes coating a second, different section of the component using a second, different coating technique. In the example of the vane assembly 60, the first section can be the vanes 62 or portions thereof, such as surfaces between the vanes 62, and the second, different section can be the platforms 64*a*/64*b* or portions thereof.

In a further example, the first coating technique used to coat the airfoils 62 is electron-beam physical vapor deposition (EB-PVD), and the second coating technique is thermal spraying, such as air plasma spraying (APS). The EB-PVD technique and the APS technique differ by at least the state of the starting coating of material (a billet for EB-PVD versus powder or wire for APS), the method of application of the starting material onto the component to be coated (electron beam evaporation for EB-PVD versus plasma melting/heating for APS) and the coating arrangement with regard to the component to be coated, coating source and/or energy source (components suspended over coating source separated from EB gun for EB-PVD versus self-contained spray device that melts and accelerates source material for APS).

The use of multiple different coating techniques to coat different sections of the vane assembly 60 or other article permits each of the selected coating techniques to be tailored to the locations that are being coated. For instance, the inner surfaces of the airfoils 62 (i.e., pressure and suction sides) can include non-line-of-sight surfaces that have shallow linear view lines, such as but not limited to surfaces with linear view lines of less than 45°. Such surfaces can be challenging to coat with a target minimum thickness. The EB-PVD technique can be tailored to provide the target minimum thickness on the inner surfaces of the airfoils 62. The APS technique can be used to coat the platforms 64*a*/64*b* with the target minimum thickness. The surfaces of the platforms 64*a*/64*b* can be line-of-sight surfaces and/or non-line-of-sight surfaces with linear view lines that are relatively close to 90°, such as but not limited to surfaces with linear view lines of greater than 45°. The use of the APS technique utilizes a relatively narrow coating plume and can better coat the surfaces of the platforms 64*a*/64*b*. The use of multiple different coating techniques thus enables the coating 66 to be provided with a tighter tolerance with respect to variation from a target minimum or average thickness.

Additionally, the use of multiple different coating techniques to coat different sections of the vane assembly 60 or other article can permit an approximately 100% reduction to non-line-of-sight coating area on platforms (in between airfoils) for vane doublets (i.e. entire platform has line-of-sight access with APS technique), 20% or greater reduction to non-line-of-sight coating area on airfoils (hidden suction side and pressure sides of airfoil) for vane doublet with EBPVD technique tailored for airfoils only, and an approximately 3× improvement in minimum coating thickness in platform non-line-of-sight coating areas (in between airfoils) with the APS technique.

Figure 4:
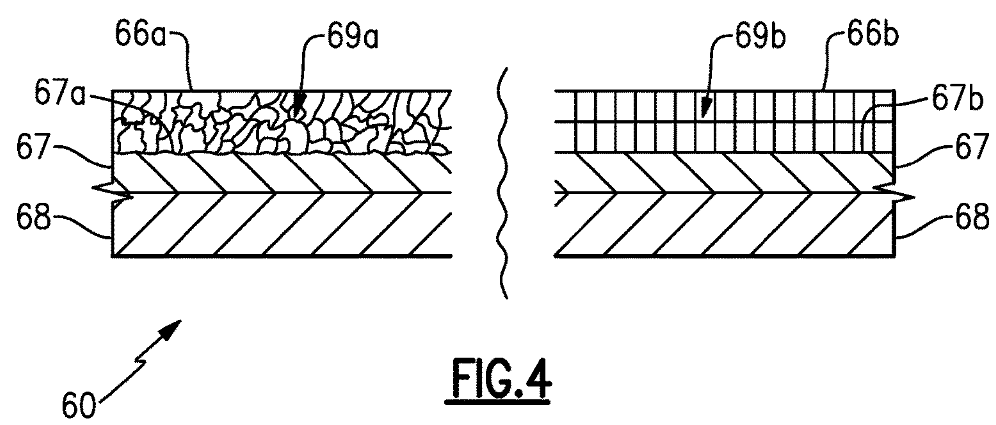
FIG. 4 illustrates cross-sections through different locations of an article, the coating having differing microstructures at the different locations.

FIG. 4 shows cross-sections of the vane assembly 60 coated according to the method 70, including the metallic body/substrate 68, bond coat 67 and coating 66 at first and second portions 66*a*/66*b*. As indicated above, the first portion 66*a* is on the platforms 64*a*/64*b* and the second portion 66*b* is on the airfoils 62 (at least between the airfoils). Due to the use of the two different coating techniques to apply the first and second portions 66*a*/66*b*, the first and second portions 66*a*/66*b* have differing microstructures. The compositions of the first and second portions 66*a*/66*b* can be equivalent. In one example based on the use of APS to deposit the first portion 66*a* and EB-PVD to deposit the second portion 66*b*, the first portion 66*a* is mono-layered and has a random grain structure 69*a* and the second portion 66*b* is mono- or multi-layered (multi-layer shown with distinct boundary in microstructure) and has a columnar grain structure 69*b*. For example, the second portion 66*b* has one to three layers. The first and portions 66*a*/66*b* can also differ in color because of the differing microstructures.

Additionally, different structures of the bond coat 67 can be used in correspondence with the differing microstructures of the first and second portions 66*a*/66*b*. In the illustrated example, the bond coat 67 under the first portion 66*a* is unpeened and thus has a relatively rough interface surface 67*a* to which the first portion 66*a* is mechanically bonded. The bond coat 67 under the second portion 66*b* is peened and thus has a relatively smooth interface surface 67*b* to which the second portion 66*b* is chemically bonded. That is, the bond coat 67 under the first portion 66*a* has a higher surface roughness than the bond coat 67 under the second portion 66*b*.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure.

What is claimed is:

1. An article comprising:

a body including a platform, first and second airfoils, and a coating on the platform and the first and second airfoils, the coating being mono-layered on the platform of the body and being mono- or multi-layered on the first and second airfoils of the body, the coating on the platform having a first microstructure that is a random grain structure and the coating on the first and second airfoils having a second, different microstructure that is a columnar microstructure.

2. The article as recited in claim 1, wherein the coating is a ceramic-based coating.

3. The article as recited in claim 1, further comprising a bond coat on the body, the bond coat having a first surface roughness on the platform and a second, different roughness on the first and second airfoils.

4. The article as recited in claim 1, further comprising a metallic bond coat on the body, the bond coat having a first surface roughness on the platform and a second, different surface roughness on the first and second airfoils, wherein the coating is a ceramic-based coating.

5. The article as recited in claim 4, wherein the first surface roughness is greater than the second surface roughness.

6. The article as recited in claim 1, wherein the coating on the platform has an equivalent composition to the coating on the first and second airfoils.

7. The article as recited in claim 1, wherein the coating is yttria stabilized zirconia.

8. The article as recited in claim 1, wherein the coating is gadolinia stabilized zirconia.

9. The article as recited in claim 1, wherein the coating that is on the first and second airfoils is between the first and second airfoils.

10. A method of coating an article, the method comprising:

applying a coating to a body of an article that has a platform and first and second airfoils, including forming the coating as a mono-layer that has a random grain structure on the platform of the body using a first coating technique and forming the coating as a mono- or multi-layer that has a columnar grain structure on the first and second airfoils of the body using a second, different coating technique.

11. The method as recited in claim 10, wherein coating is a ceramic-based coating.

12. The method as recited in claim 10, wherein the first coating technique is physical vapor deposition and the second coating technique is thermal spraying.

13. A gas turbine engine comprising:

an article including a body having a platform, first and second airfoils, and a coating on the platform and the first and second airfoils, the coating being mono-layered on the platform of the body and being mono- or multi-layered on the first and second airfoils of the body, the coating on the platform having a first microstructure that is a random grain structure and the coating on the first and second airfoils having a second, different microstructure that is a columnar grain structure.

14. The gas turbine engine as recited in claim 13, wherein the coating is a ceramic-based coating.

15. The gas turbine engine as recited in claim 13, further comprising a metallic bond coat on the body, the bond coat having a first surface roughness on the platform and a second, different surface roughness on the first and second airfoils, wherein the coating is a ceramic-based coating.

16. The gas turbine engine as recited in claim 15, wherein the first surface roughness is greater than the second surface roughness.

* * * * *